(12) United States Patent
Chen et al.

(10) Patent No.: US 9,699,931 B1
(45) Date of Patent: Jul. 4, 2017

(54) SERVER CHASSIS

(71) Applicant: Super Micro Computer Inc., San Jose, CA (US)

(72) Inventors: Richard S. Chen, San Jose, CA (US); Chaoching Wu, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/192,354

(22) Filed: Jun. 24, 2016

(51) Int. Cl.
*H05K 7/16* (2006.01)
*H05K 7/14* (2006.01)
*G06F 1/18* (2006.01)
*G11B 33/12* (2006.01)

(52) U.S. Cl.
CPC ........... *H05K 7/1489* (2013.01); *G06F 1/187* (2013.01); *G11B 33/125* (2013.01); *G11B 33/128* (2013.01); *H05K 7/1411* (2013.01); *H05K 7/1487* (2013.01)

(58) Field of Classification Search
CPC ..... G06F 1/187; G11B 33/128; G11B 33/125; H05K 7/1487; H05K 7/1411; H05K 7/1489

USPC ......... 361/679.32, 679.37, 679.39, 724, 727, 361/755
See application file for complete search history.

(56) References Cited

U.S. PATENT DOCUMENTS

| 7,012,803 B1* | 3/2006 | Austin .................... G06F 1/187 361/679.33 |
| 2013/0070422 A1* | 3/2013 | Dunham ................. G06F 1/187 361/725 |
| 2015/0366095 A1* | 12/2015 | Junkins ................ H05K 5/0256 361/679.31 |

\* cited by examiner

*Primary Examiner* — James Wu
(74) *Attorney, Agent, or Firm* — Chun-Ming Shih; HDLS IPR Services (57) ABSTRACT

A server chassis includes a first tray, a second tray, a position latch and a position cam. The second tray and the first tray are pivoted with each other. The position latch is fixed on the first tray and moved accompany with the first tray. A protrusion and a first engaging structure are formed at an edge of the position latch. The position cam is pivoted on the second tray. An actuating nose and a second engaging structure are formed at an edge of the position cam. The actuating nose is located in a moving interval of the protrusion. The second engaging structure and the first engaging structure are contour matched with each other. Thereby, the position cam can be rotated to self-lock or self-unlock the position latch.

12 Claims, 12 Drawing Sheets

SERVER CHASSIS

BACKGROUND OF THE INVENTION

Technical Field

The present disclosure is related to a server chassis, particularly a self-positionable and self-unlockable server chassis.

Description of Related Art

Usually, a conventional server chassis contains numerous HDDs (Hard Disk Drive) therein, and the HDDs are usually arranged compactly to efficiently use space in the server chassis. Therefore, it is inconvenient to maintain the HDDs. In order to allow an operator maintain the HDDs, a conventional arrangement includes a subsidiary tray arranged in the drawer tray and the subsidiary tray could be rotate relative the drawer tray. The subsidiary tray could be raised to allow an operator maintain the HDDs therein.

Usually, the subsidiary tray should be fixed by a latch while folded in the tray, and an operator should release the latch before raising the subsidiary tray. A disadvantage of the aforementioned structure is that an operator should operate a heavy subsidiary tray fully loaded hard drives, and it is difficult to operate the latch by single operator. Therefore, the conventional server chassis is inconvenient for maintenance.

In views of this, in order to solve the above disadvantage, the present inventor studied related technology and provided a reasonable and effective solution in the present disclosure.

SUMMARY OF THE INVENTION

A self-positionable and self-unlockable server chassis is provided in the present disclosure.

A server chassis including a first tray, a second tray, a position latch and a position cam is provided in the present disclosure. The second tray and the first tray are pivoted with each other. The position latch is fixed on the first tray and moved accompany with the first tray. A protrusion and a first engaging structure are formed at an edge of the position latch. The position cam is pivoted to the second tray. An actuating nose and a second engaging structure are formed at an edge of the position cam. The actuating nose is located in a moving route of the protrusion. The second engaging structure and the first engaging structure are contour matched with each other.

While the first tray and second tray are relatively rotated to a locking position, the actuating nose can be abutted by the protrusion to rotate the position cam from an initial position to where the first engaging structure and second engaging structure are engaged with each other.

While the first tray and the second tray are relatively rotated to release from the locking position, the second engaging structure is abutted by the first engaging structure to rotate to position cam to where the first engaging structure and the second engaging structure separated.

Preferably, the first engaging structure includes a broken edge, and the second engaging structure includes a position nose contour matched with the broken edge. The position cam is pivoted to the second tray via a pivot axis. The position cam includes a hard inner ring sleeving the pivot axis and an elastic main body form on the hard inner ring. The actuating nose is formed on the elastic main body.

Preferably, a stopping nose is formed at an edge of the position cam, a stopping wall is arranged on the second tray, and the stopping wall is located in a moving route of the stopping nose. The position cam is pivoted on the second tray via a pivot axis, and the position cam includes a hard inner ring sleeving the pivot axis and an elastic main body formed on the hard inner ring. The stopping nose is formed on the elastic main body.

Preferably, the position cam is pivoted on the second tray via a pivot axis. The position cam includes a hard inner ring sleeving the pivot axis. The position cam includes an elastic main body formed on the hard inner ring, and the actuating nose is formed on the elastic main body.

Preferably, a resetting element is connected between the position cam and the second tray between. A first swapping case is arranged on the first tray. A second swapping case is arranged on the second tray.

The server chassis of the present disclosure could self-lock or self-unlock the position latch via the position cam rotate.

BRIEF DESCRIPTION OF DRAWING

The present disclosure can be more fully understood by reading the following detailed description of the embodiment, with reference made to the accompanying drawings as follows.

DETAILED DESCRIPTION OF THE INVENTION

Figure 1:
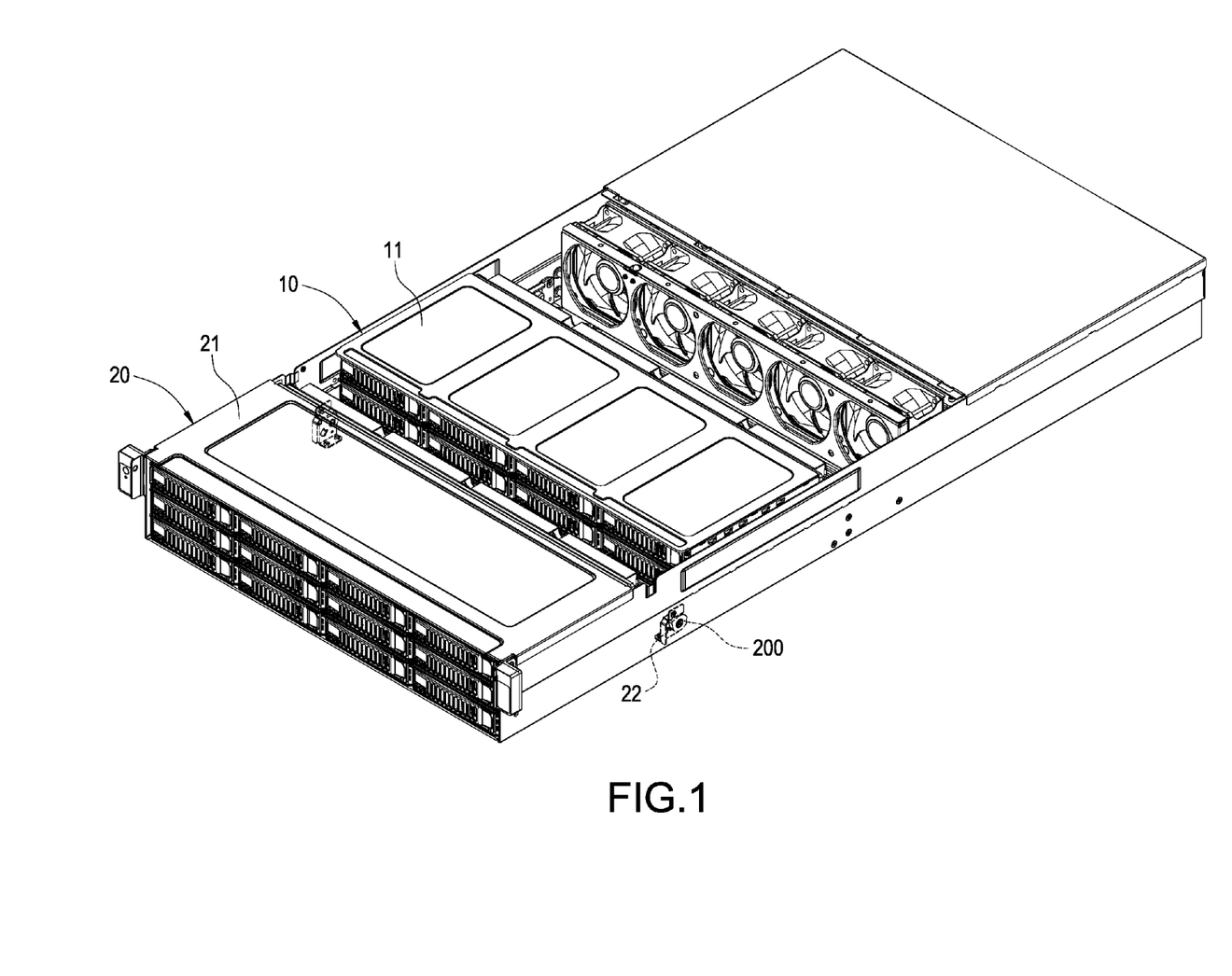
FIG. 1 is a perspective view showing the server chassis in an embodiment of the present disclosure.
Figure 2:
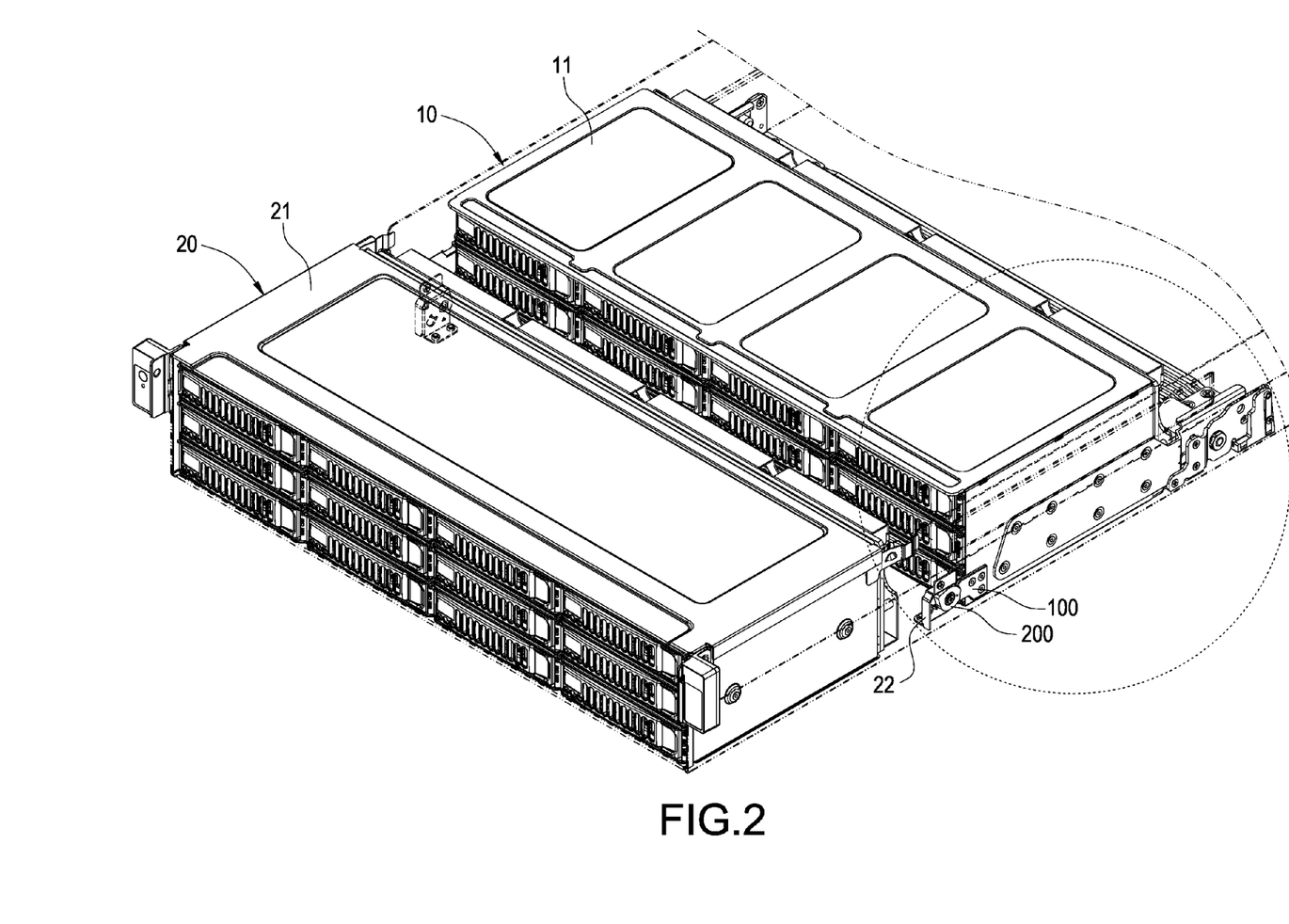
FIG. 2 is a schematic view showing the server chassis in an embodiment of the present disclosure at the locking position.
Figure 3:
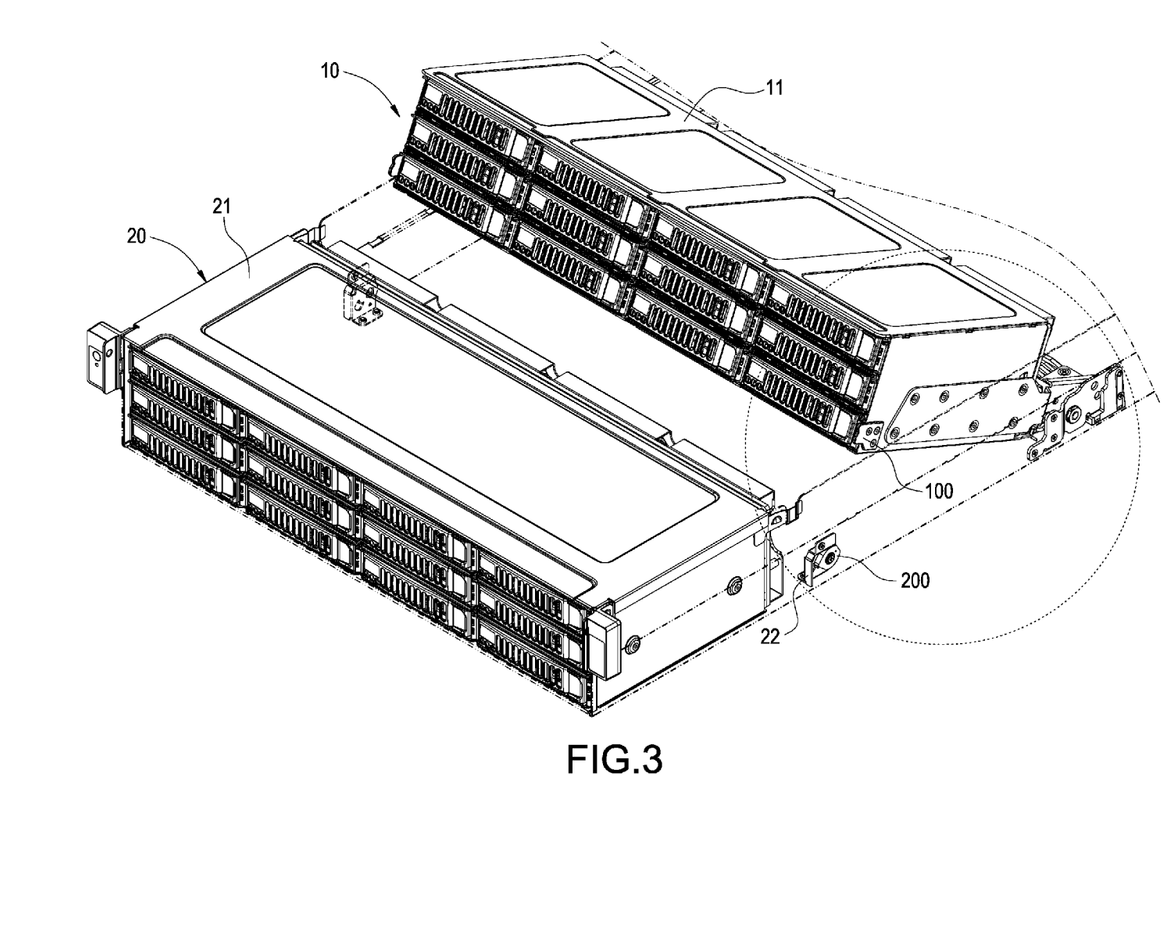
FIG. 3 is a schematic view showing the server chassis in an embodiment of the present disclosure released from the locking position.
Figure 4:
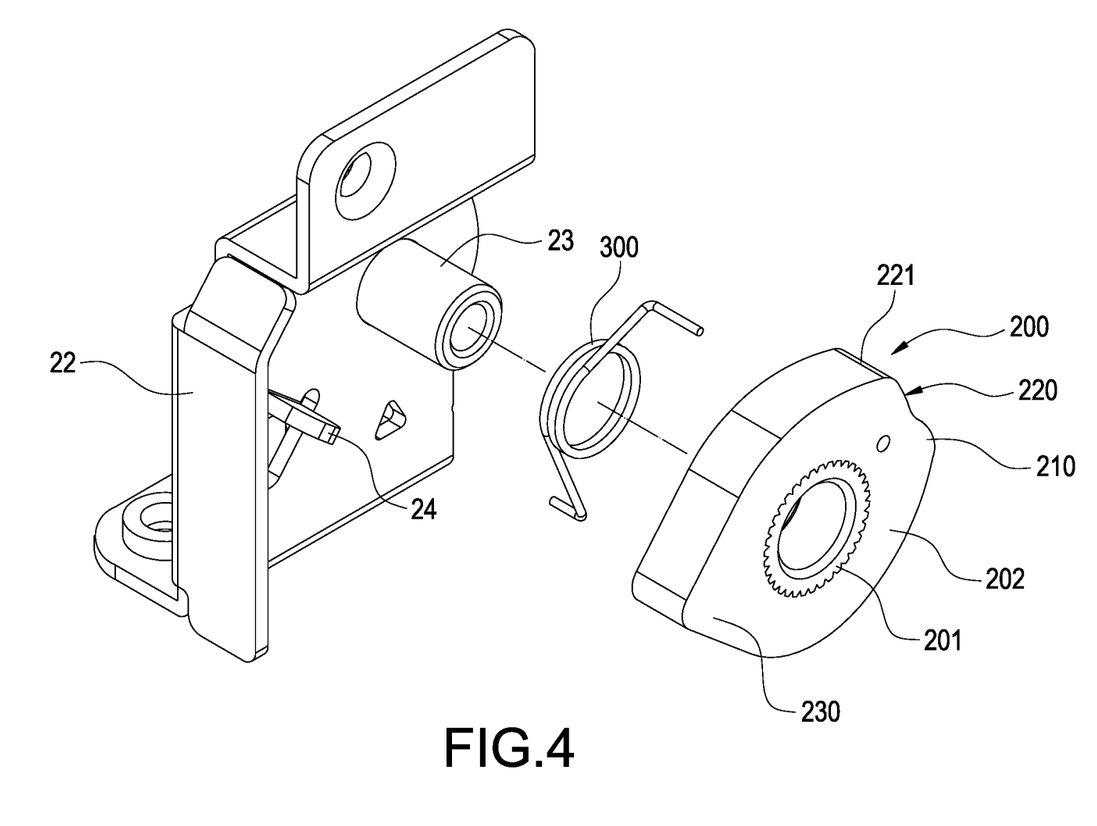
FIG. 4 is a perspective view showing the position cam of the server chassis in an embodiment of the present disclosure.
Figure 5:
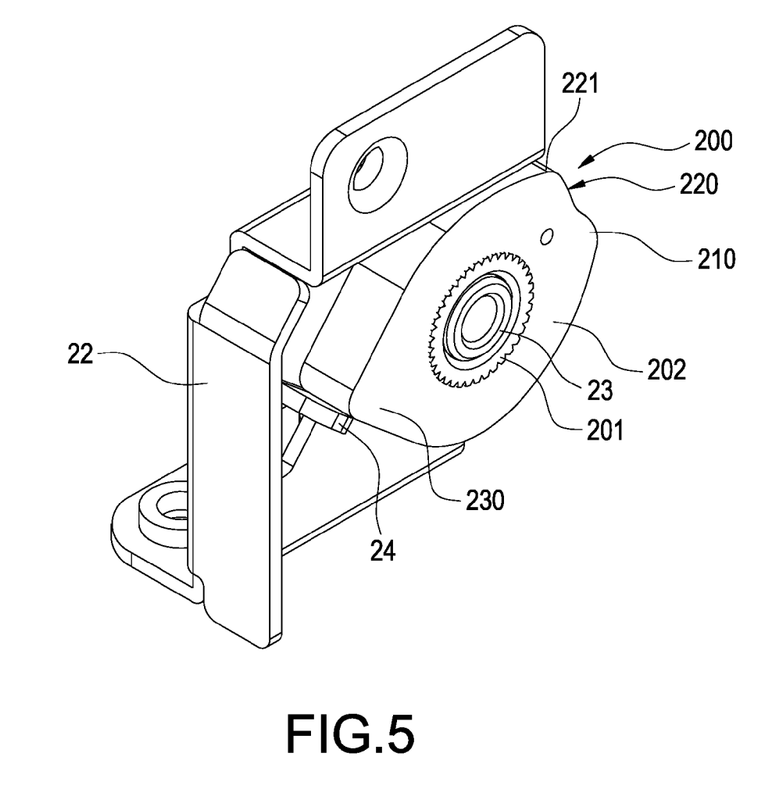
FIG. 5 is another perspective view showing the position cam of the server chassis in an embodiment of the present disclosure.
Figure 6:
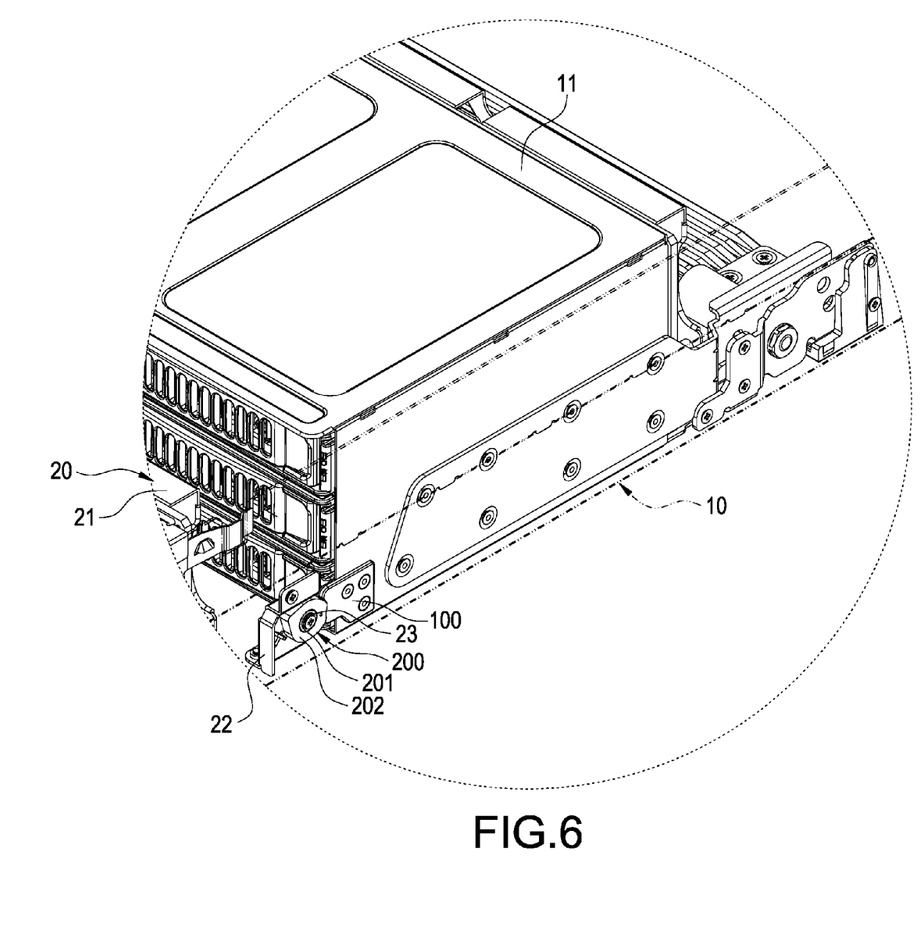
FIG. 6 is a partial enlarged view of FIG. 2.
Figure 7:
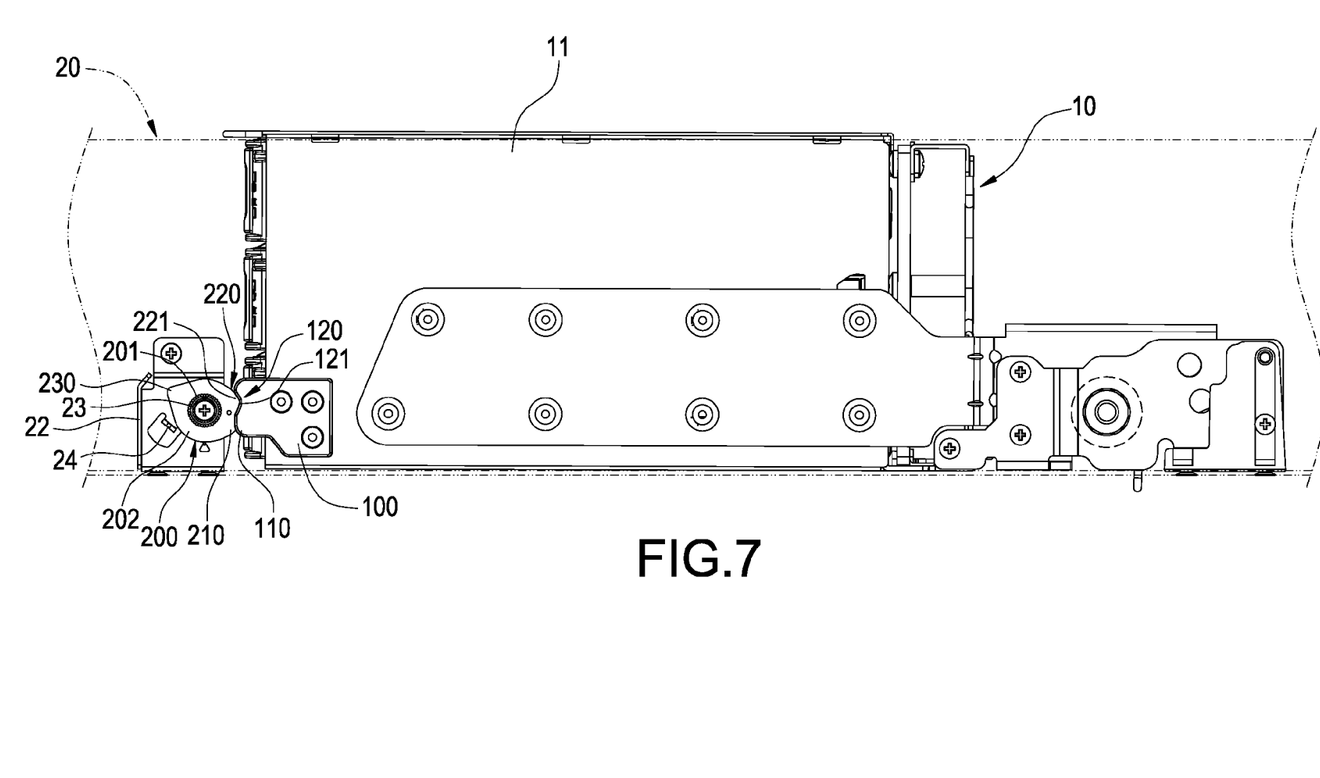
FIG. 7 is a schematic view showing the position latch of the server chassis in an embodiment of the present disclosure snapping with the position cam.

Please refer to FIGS. 1 to 3, a server chassis including a first tray 10, a second tray 20, a position latch 100 and a position cam 200 is provided in the present disclosure.

The first tray 10 and the second tray 20 are pivoted with each other, in an embodiment of the present disclosure, the first tray 10 is preferably pivoted to the second tray 20 and carried on the second tray 20, but the present disclosure should not be limited by the embodiment, the second tray 20 might be pivoted on the first tray 10 and carried on the first tray 10. Please refer to FIG. 3, in an embodiment of the present disclosure, the first tray 10 could be rotated and thereby raised from second tray 20.

Please refer to FIGS. 1 to 3, in the present embodiment, a first swapping case 11 is arranged on the first tray 10, and the first swapping case 11 is used to contain at least a hard drive therein. A second swapping case 21 is arranged on the second tray 20, and the second swapping case 21 is used to contain at least a hard drive. While the first tray 10 is folded on the second tray 20 according to FIGS. 1 and 2, the first swapping case 11 and the second swapping case 21 are arranged compact. While the first tray 10 is raised according to FIG. 3, the first swapping case 11 is raised over the second swapping case 21 for maintaining the HDDs in the first swapping case 11.

Please refer to FIGS. 1 to 4, in the present embodiment, the second tray 20 preferably includes a cover 22, and the cover 22 is arranged on an internal wall of the second tray 20. A pivot axis 23 and a stopping wall 24 are arranged in the cover 22 and protruding to inner of the cover 22.

Please refer to FIGS. 1 to 3, the position latch 100 is arranged on the first tray 10 and moved along a curve path accompany with the first tray 10. A protrusion 110 and a first engaging structure 120 are formed at an edge of the position latch 100. In the present embodiment, the first engaging structure 120 preferably includes a broken edge 121 form on at edge of the position latch 100.

Figure 8:
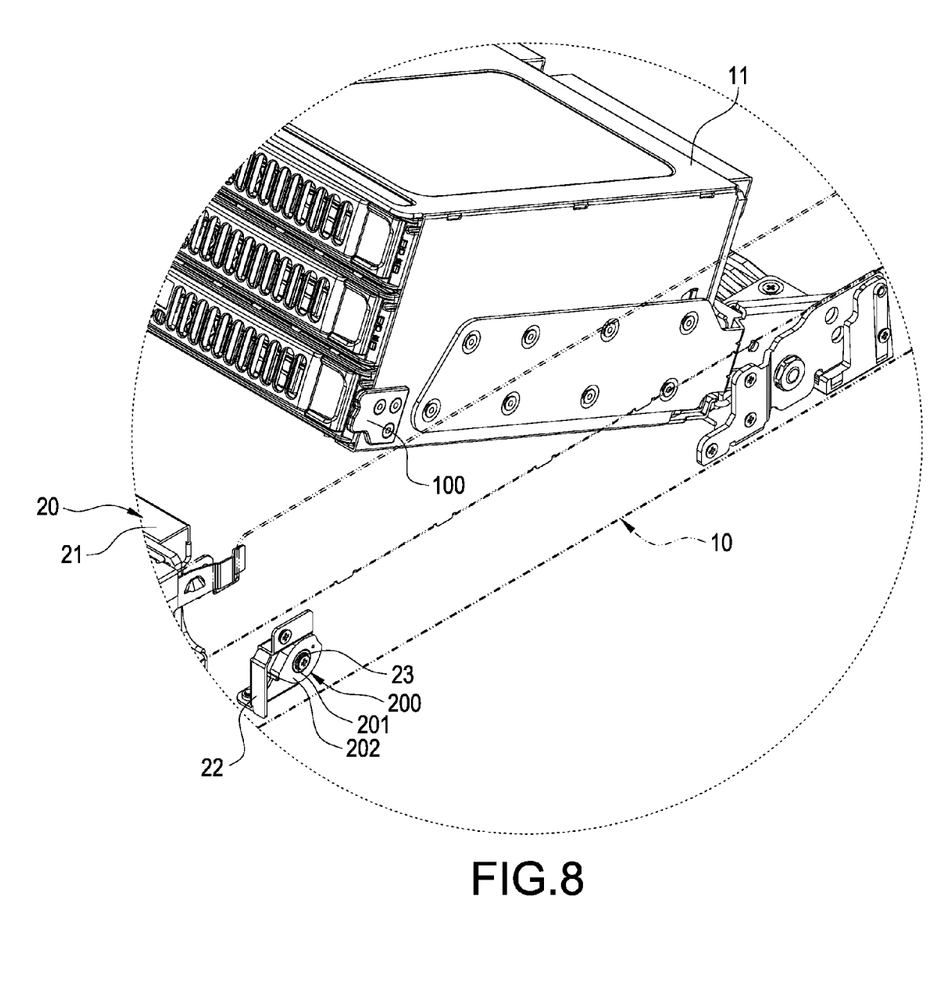
FIG. 8 is a partial enlarged view of FIG. 3.
Figure 9:
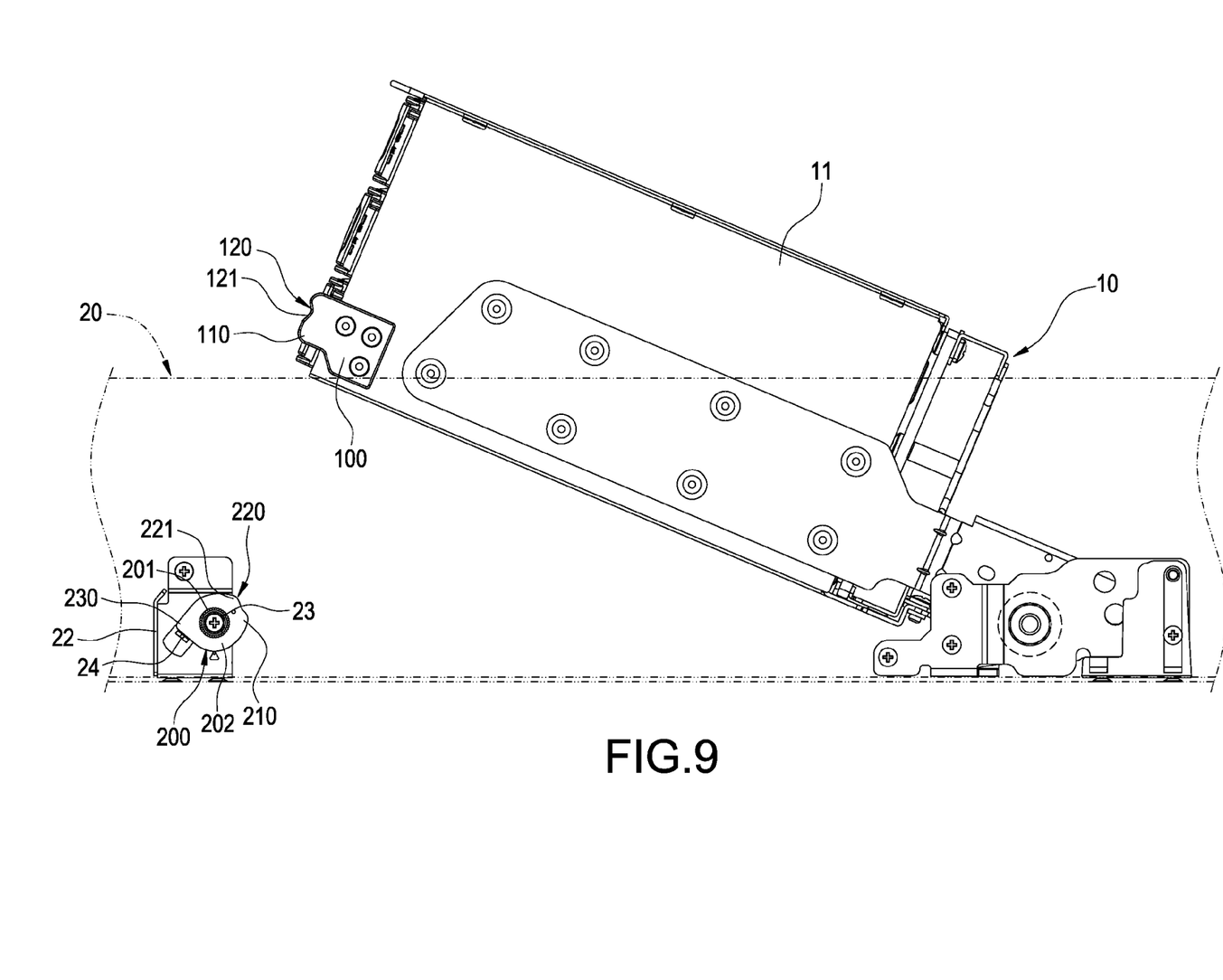
FIG. 9 is a schematic view showing the position latch of the server chassis in an embodiment of the present disclosure released from the position cam.

Please refer to FIGS. 1, 4, 5 and 10. In the present embodiment, the position cam 200 is contained in the cover 22 and pivoted on the pivot axis 23, and thereby pivoted on an internal wall of the second tray 20, but the present disclosure should not be limited by the embodiment, The position cam 200 might be pivoted on the internal wall of the second tray 20 by other means (for example, the pivot axis 23 might be directly installed on an internal wall of the second tray 20). The position cam 200 includes a hard inner ring 201 and an elastic main body 202, the hard inner ring 201 is sleeved on the pivot axis 23, for rotating and thereby avoid abrasion; the elastic main body 202 is formed on the hard inner ring 201 by insert molding. In the present embodiment, the elastic main body 202 is extended from an out edge of the hard inner ring 201 and thereby formed a plate. An actuating nose 210 is formed at an out edge of the elastic main body 202, a second engaging structure 220 and a stopping nose 230, and the actuating nose 210 is located in a curve moving route of the protrusion 110 on the position latch 100. The second engaging structure 220 and the first engaging structure 120 are contour matched with each other. In the present embodiment, the second engaging structure 220 includes a position nose 221, and the position nose 221 and the broken edge 121 of the first engaging structure 120 are contour matched with each other. The aforementioned stopping wall 24 is located in a moving route of the stopping nose 230, a terminal of a rotating route of the position cam 200 is thereby limited, and the terminal is an initial position shown in FIGS. 8 to 10.

Figure 10:
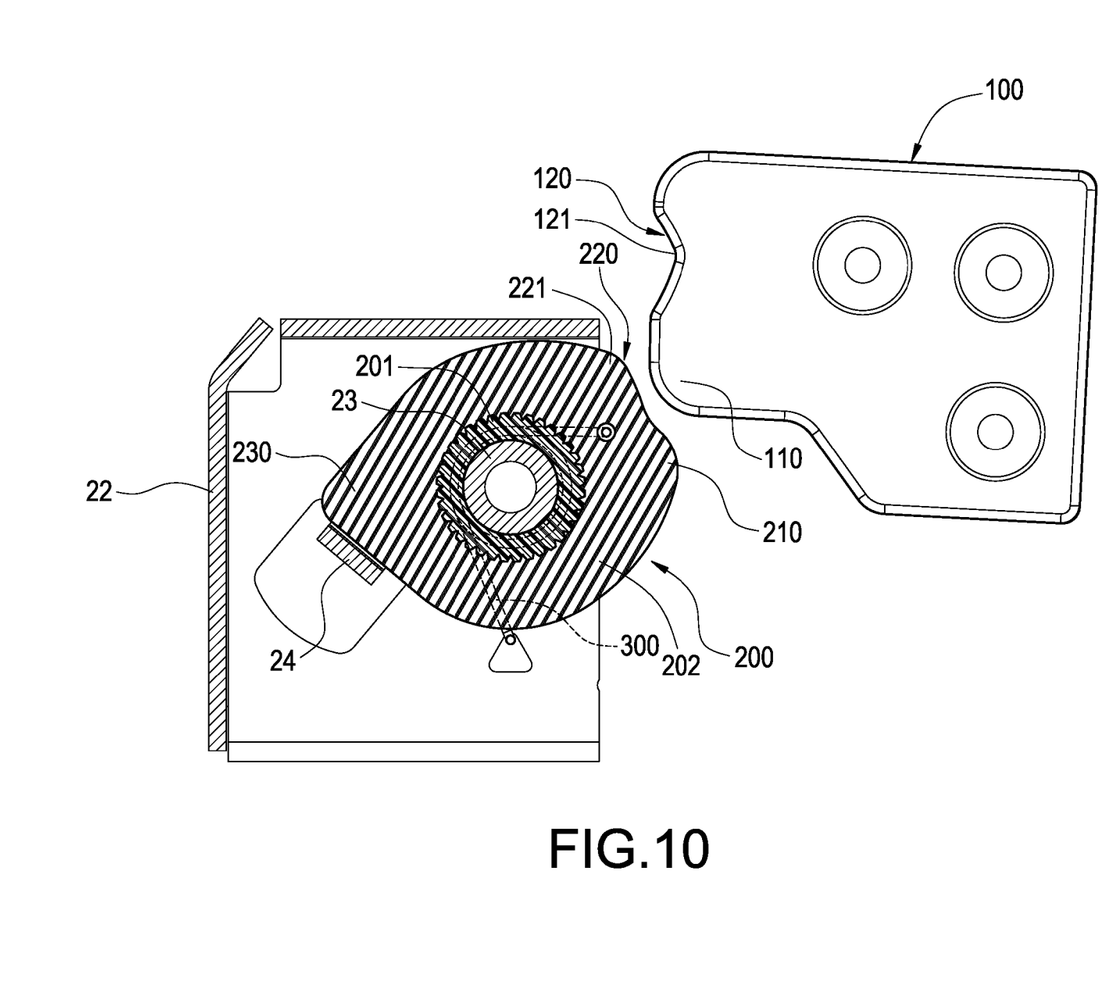
FIGS. 10 to 12 is schematic views showing motions snapping into position cam of the position latch of the server chassis in an embodiment of the present disclosure.
Figure 11:
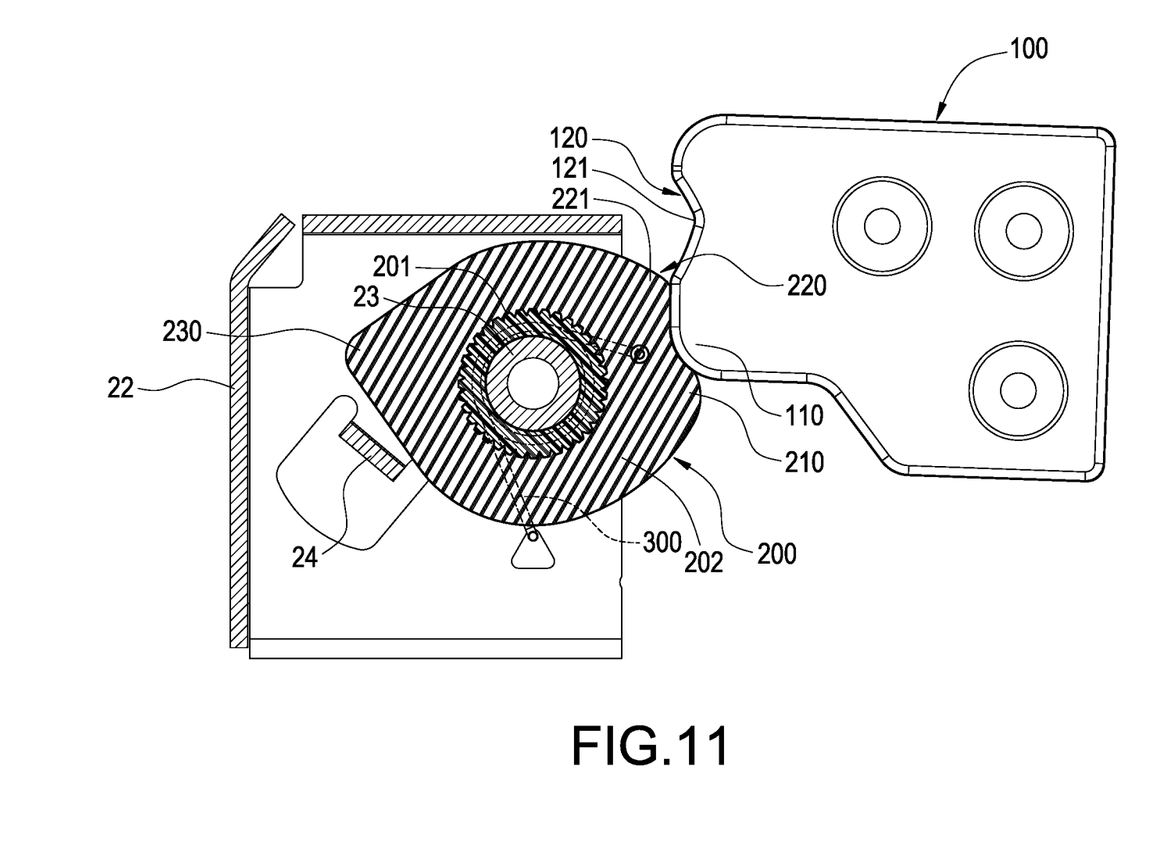
Figure 12:
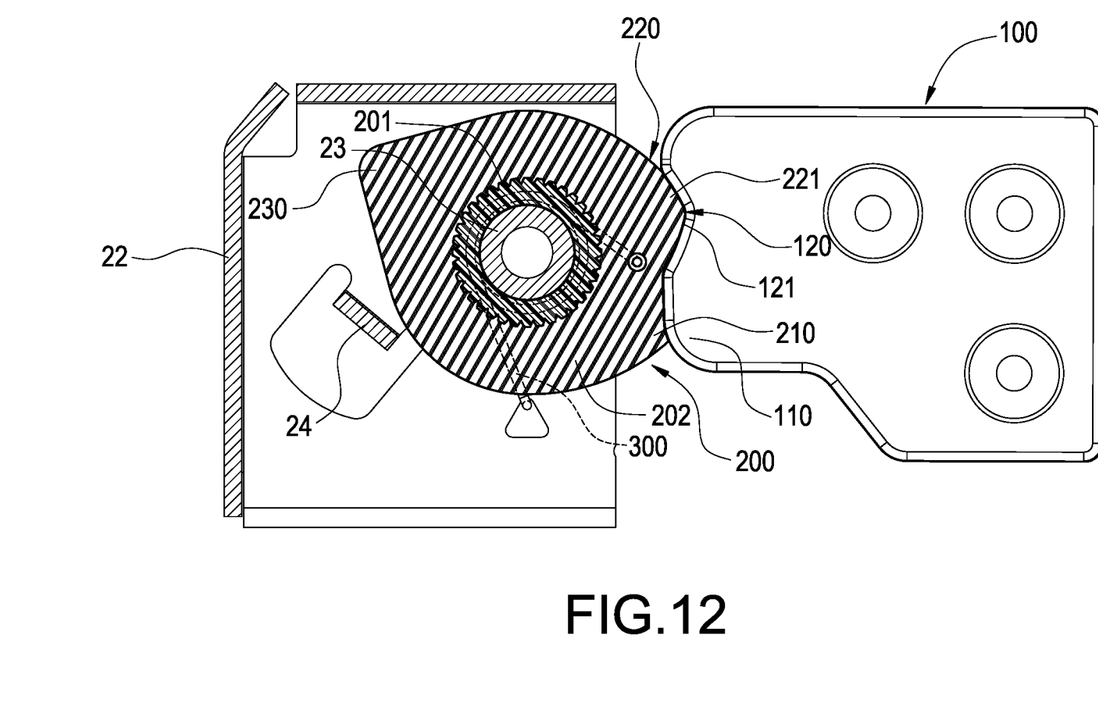

While the first tray 10 is rotated relative to the second tray 20 to a locking position shown in FIGS. 1, 2, 6 and 7, please sequentially refer to FIG. 10 to FIG. 12, the protrusion 110 could abut the actuating nose 210 to rotate the position cam 200 from the initial position shown in FIG. 10. While the first tray 10 is rotated to the locking position, the position cam 200 is meanwhile rotate to a position shown in FIG. 12, the broken edge 121 of the first engaging structure 120 and the position nose 221 of the second engaging structure 220 are engaged with each other. The elastic main body 202 could be compressed, and the first engaging structure 120 and second engaging structure 220 are thereby smoothly engaged.

While the first tray 10 is rotated relative to the second tray 20 and released from the locking position shown in FIGS. 1, 2, 6 and 7, please sequentially refer to FIGS. 12 to 10, the broken edge 121 of the first engaging structure 120 could abut the position nose 221 of the second engaging structure 220 to rotate the position cam 200, the first engaging structure 120 and the second engaging structure 220 are thereby separated, and the broken edge 121 abut the position nose 221 to reset the cam rotate to the initial position shown in FIG. 10. The elastic main body 202 could be compressed and the first engaging structure 120 and second engaging structure 220 are thereby smoothly separated.

Please refer to FIG. 4 and FIG. 10 to FIG. 12, in the present embodiment, a resetting element 300 is preferably connected between the position cam 200 and the cover 22 to add the position cam 200 rotate to reset. The structure of the resetting element 300 is not limited in the present disclosure. In the present embodiment, the resetting element 300 is preferably a cylindrical spring, each end of the resetting element 300 (cylindrical spring) respectively hooks the position cam 200 and the cover 22 on the internal of the second tray 20. While the position cam 200 is rotated relative to the second tray 20, a deformation of the resetting element 300 results an elastic force. The elastic force is applied to the position cam 200, the position cam 200 is thereby rotate and reset to the initial position, and the position latch 100 is thereby released from the position cam 200.

The server chassis of the present disclosure could self-lock to or self-unlock from the position latch 100 via rotating the position cam 200. Thereby, the first tray 10 and the second tray 20 could be self-positioned or self-unlocked. Therefore, the rotate cam 200 could be rotated by the position latch 100 to lock while an operator raises the first tray 10, and the operator should not additionally unlock the first tray 10 and second tray 20; the cam 200 could be rotated by the position latch 100 to engage and lock the position latch 100 while an operator brings the first tray 10 back to the second tray 20, and the operator should not additionally lock the first tray 10 with the second tray 20. Compared with conventional server chassis, the server chassis of the present disclosure is easier to be operated and maintained.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:

1. A server chassis comprising:
   a first tray;
   a second tray pivoted with the first tray;
   a position latch fixed on the first tray and movable accompany with the first tray, a protrusion and a first engaging structure being formed at an edge of the position latch; and
   a position cam pivoted on the second tray, an actuating nose and a second engaging structure being formed at an edge of the position cam, the actuating nose being located in a moving route of the protrusion, and the second engaging structure and the first engaging structure being contour matched with each other.

2. The server chassis according to claim 1, wherein while the first tray and the second tray are relatively rotated to a locking position, the protrusion abuts the actuating nose to rotate the position cam from an initial position to where the first engaging structure and the second engaging structure are engaged with each other.

3. The server chassis according to claim 2, wherein while the first tray and the second tray are relatively rotated to release from the locking position, the first engaging structure abuts the second engaging structure to rotate the position cam to where the first engaging structure and the second engaging structure are separated.

4. The server chassis according to claim 1, wherein the first engaging structure comprises a broken edge, and the second engaging structure comprises a position nose contour matched with the broken edge.

5. The server chassis according to claim 4, wherein the position cam is pivoted to the second tray via a pivot axis, the position cam comprises a hard inner ring sleeving the pivot axis and an elastic main body formed on the hard inner ring, the actuating nose is formed on the elastic main body.

6. The server chassis according to claim 1, wherein a stopping nose is formed at an edge of the position cam, a stopping wall is arranged on the second tray, and the stopping wall is located in a moving route of the stopping nose.

7. The server chassis according to claim 6, wherein the position cam is pivoted to the second tray via a pivot axis, the position cam comprises a hard inner ring sleeving the pivot axis and an elastic main body form on the hard inner ring, and the stopping nose is formed on the elastic main body.

8. The server chassis according to claim 1, wherein the position cam is pivoted to the second tray via a pivot axis, and the position cam comprises a hard inner ring sleeving the pivot axis.

9. The server chassis according to claim 8, wherein the position cam comprises an elastic main body formed on the hard inner ring, and the actuating nose is formed on the elastic main body.

10. The server chassis according to claim 1, wherein a resetting element is connected between the position cam and the second tray.

11. The server chassis according to claim 1, wherein a first swapping case is arranged on the first tray.

12. The server chassis according to claim 1, wherein a second swapping case is arranged on the second tray.

* * * * *